United States Patent [19]
Bialas, Jr. et al.

[11] Patent Number: 6,097,215
[45] Date of Patent: Aug. 1, 2000

[54] LOW POWER VOLTAGE TRANSLATION CIRCUIT

[75] Inventors: John S. Bialas, Jr.; John E. Gersbach, both of South Burlington; Charles R. London, Burlington, all of Vt.

[73] Assignee: International Business Machines Corporation, Armonk, N.Y.

[21] Appl. No.: 09/083,746

[22] Filed: May 22, 1998

[51] Int. Cl.⁷ .................. H03K 19/0175; H03K 19/094
[52] U.S. Cl. .................. 326/68; 326/68; 326/80; 326/81; 326/83; 326/86; 326/121
[58] Field of Search .................. 326/68, 80, 81, 326/83, 86, 121

[56]  References Cited

U.S. PATENT DOCUMENTS

| | | | |
|---|---|---|---|
| 4,984,204 | 1/1991 | Sato et al. | 365/189 |
| 5,300,835 | 4/1994 | Assar et al. | 307/475 |
| 5,321,324 | 6/1994 | Hardee et al. | 326/68 |
| 5,363,001 | 11/1994 | Vinal | 327/55 |
| 5,426,381 | 6/1995 | Flannagan et al. | 326/66 |
| 5,559,996 | 9/1996 | Fujioka | 395/500 |
| 5,952,847 | 9/1999 | Plant et al. | 326/80 |

FOREIGN PATENT DOCUMENTS 0 337 869 A1  4/1989  European Pat. Off. .

*Primary Examiner*—Michael Tokar
*Assistant Examiner*—Vibol Tan
*Attorney, Agent, or Firm*—Ratner & Prestia; Eugene I. Shkurko

[57]  ABSTRACT

A voltage translation circuit translates an input signal having a first voltage level and a second voltage level to an output signal having the second voltage level and a third voltage level respectively. The voltage translation circuit according to the present invention includes a regenerative circuit having a first terminal and a second terminal. The voltage level at the first terminal increases responsive to the voltage level at the second terminal decreasing. The voltage level at the second terminal increases responsive to the voltage level at the first terminal decreasing. The voltage level at the first terminal defines the output signal. A first switch is coupled to the first terminal of said regenerative circuit, such that closing the first switch decreases the voltage level at the first terminal. A second switch is coupled to the second terminal of said regenerative circuit, such that closing the second switch decreases the voltage level at the second terminal.

29 Claims, 6 Drawing Sheets

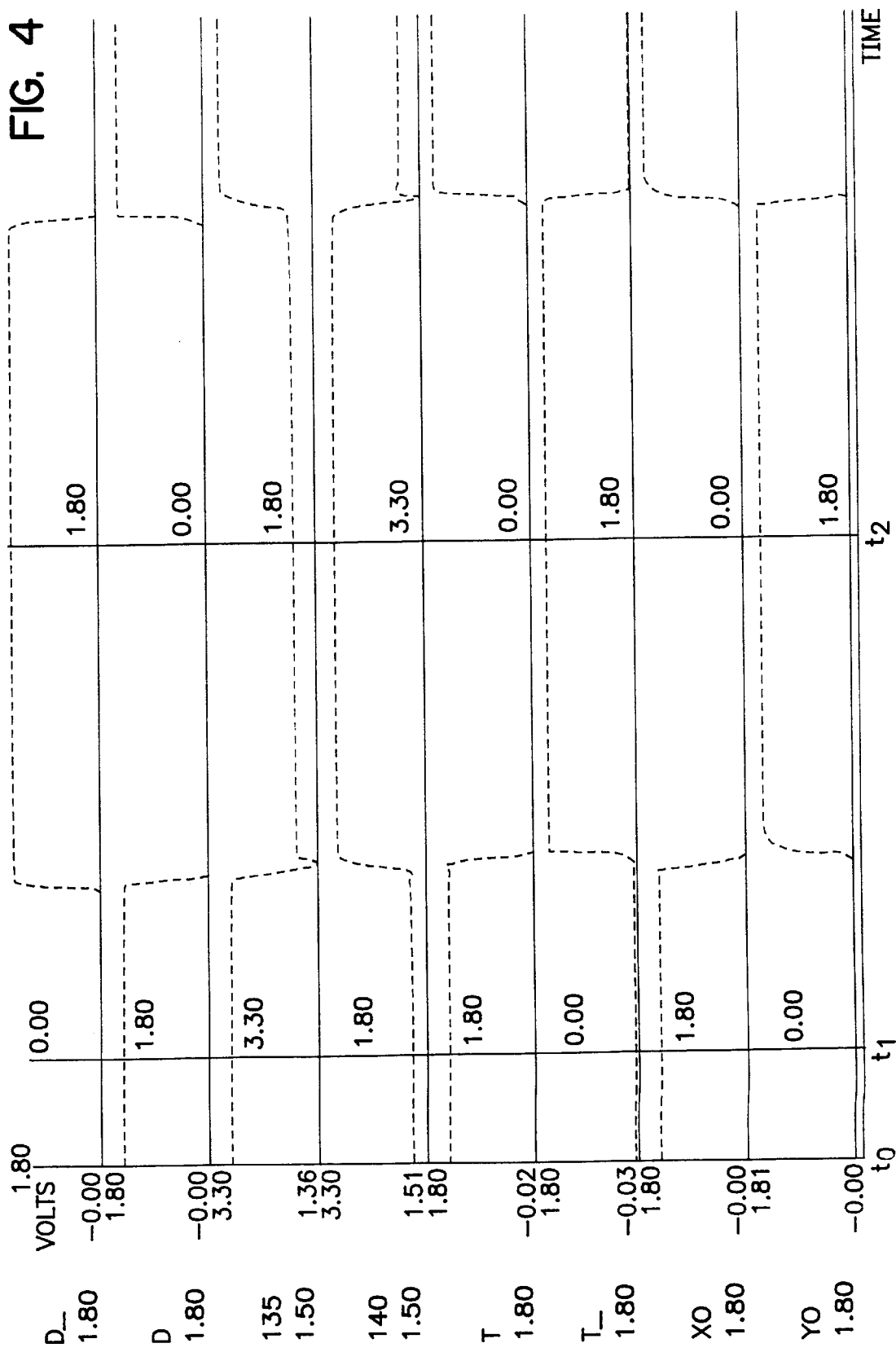

LOW POWER VOLTAGE TRANSLATION CIRCUIT

FIELD OF THE INVENTION

The present invention relates generally to circuits translating between voltage levels and, more particularly, to a voltage translation circuit translating an input signal having first and second voltage levels to an output signal having second and third voltage levels.

BACKGROUND OF THE INVENTION

When interfacing with an input output (I/O) device, an I/O interface is used. So that the I/O interface may communicate properly with the I/O device, a certain output voltage swing is typically desired. This voltage swing may be provided by a device driver situated within the I/O interface. The device driver may be in the form of a microprocessor device.

Microprocessor devices typically are powered by voltage supplies that may provide, for example, a voltage swing between 0 and VDD. This voltage swing between 0 and VDD may be different than the voltage swing requirements of the device to which the interface is coupled. For example, the I/O device may desirably rely upon a voltage swing between 0 and OVDD volts.

If the microprocessor voltage swings between 0 and VDD and the device relies upon a voltage swing between 0 and OVDD, a conversion is desirably required so that the microprocessor and the device driver may communicate. In some cases, the difference between VDD and OVDD may be as much as two times that of VDD. For example, the VDD voltage may be 2.5 volts or 3.3 volts while the OVDD voltage may be 5 volts. In another example, the VDD voltage may be 1.8 volts while the OVDD voltage may be 3.3 volts.

To enable a device driver with a voltage swing between 0 and VDD to operate with an output device which desirably expects a voltage swing between 0 and OVDD, a translation circuit may be used. An exemplary translation circuit is described, for example, in U.S. Pat. No. 5,300,835 to Assar et al. As set forth in the aforementioned patent, it is known to use together a variety of components with different voltage swings. Various circuits for performing these conversions are well known in the art. However, some of these circuit designs may result in undesirably slow signal throughput. In other designs, DC power may be disadvantageously burned as the signal swing translation is occurring. This may be undesirable in situations where power conservation is desired.

SUMMARY OF THE INVENTION

The present invention relates to a voltage translation circuit for translating an input signal having a first voltage level and a second voltage level to an output signal having the second voltage level and a third voltage level respectively. The voltage translation circuit according to an exemplary embodiment of the present invention includes a regenerative circuit having a first terminal and a second terminal. The voltage level at the first terminal increases responsive to the voltage level at the second terminal decreasing. The voltage level at the second terminal increases responsive to the voltage level at the first terminal decreasing. The voltage level at the first terminal defines the output signal. A first switch is coupled to the first terminal of the regenerative circuit, such that closing the first switch decreases the voltage level at the first terminal. A second switch is coupled to the second terminal of the regenerative circuit, such that closing the second switch decreases the voltage level at the second terminal.

It is to be understood that both the foregoing general description and the following detailed description are exemplary, but are not restrictive, of the invention.

BRIEF DESCRIPTION OF THE DRAWING

FIGS. 3, 3A and 3B, in combination, is a circuit diagram showing the internal circuitry of the blocks of the voltage translation circuit of FIG. 2.

FIG. 4 is a signal diagram showing voltage levels at selected nodes of the voltage translation circuit illustrated in FIG. 3.

DETAILED DESCRIPTION OF THE INVENTION

Figure 1:
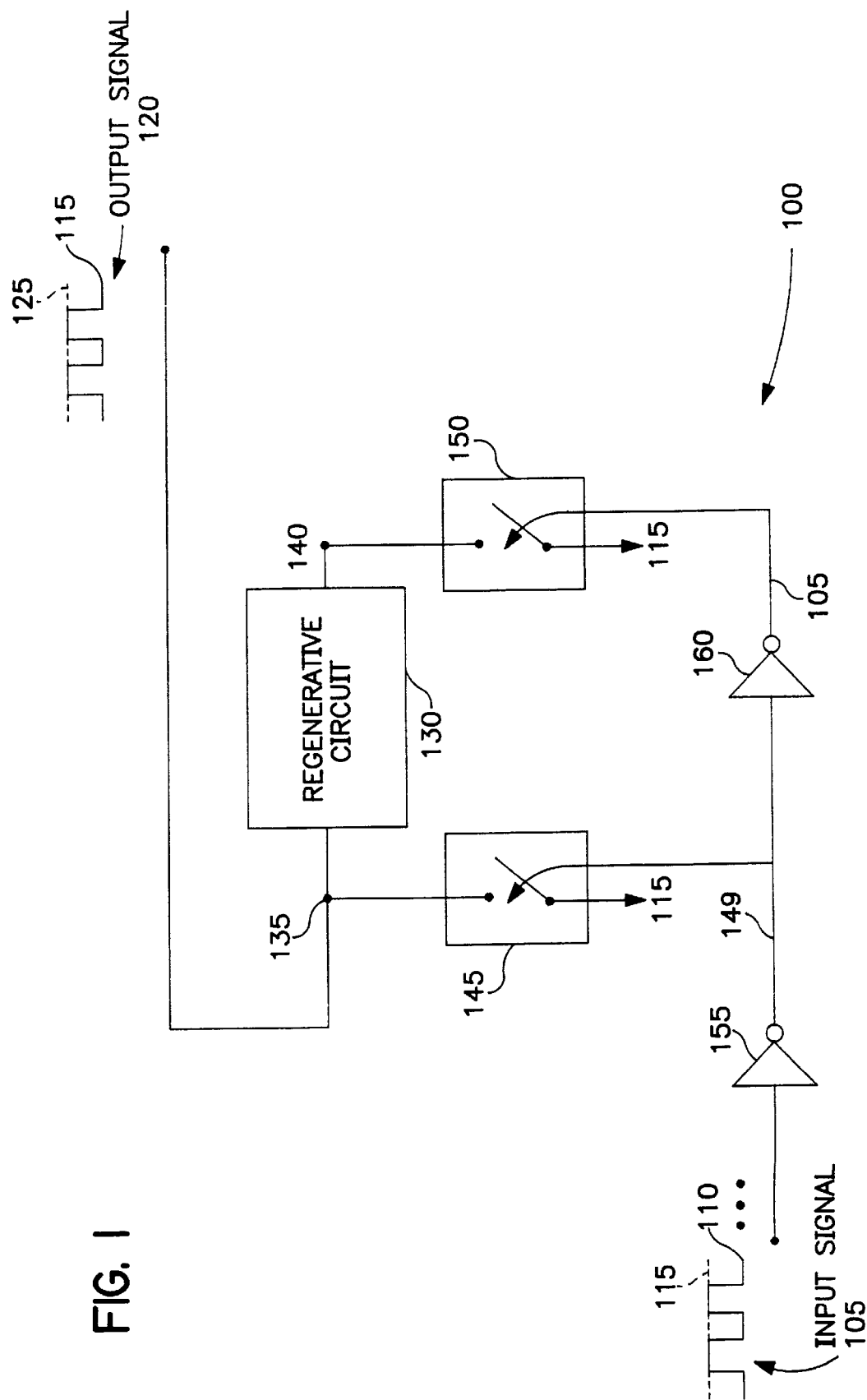
FIG. 1 is a block diagram of a voltage translation circuit according to an exemplary embodiment of the present invention.

FIG. 1 is a block diagram of a voltage translation circuit 100 according to an exemplary embodiment of the present invention. Voltage translation circuit 100 translates an input signal 105 having a first voltage level 110 and a second voltage level 115 to an output signal 120 having second voltage level 115 and a third voltage level 125 respectively.

In order to translate input signal 100 to output signal 120, voltage translation circuit 100 includes a regenerative circuit 130 having a first terminal 135 and a second terminal 140. The voltage level at first terminal 135 of regenerative circuit 130 increases to third voltage level 125 responsive to the voltage level at second terminal 140 decreasing to substantially second voltage level 115. Similarly, the voltage level at second terminal 140 of regenerative circuit 130 increases to third voltage level 125 responsive to the voltage level at first terminal 135 decreasing to substantially second voltage level 115. The voltage level at the first terminal 135 defines output signal 120.

Voltage translation circuit 100 further includes a first switch 145 coupled to first terminal 135 of regenerative circuit 130. When first switch 145 closes, first switch 145 decreases the voltage level at first terminal 135. In particular, first switch 145 closes responsive to input signal 105 decreasing from second voltage level 115 to first voltage level 110, thereby decreasing the voltage level at first terminal 135 of regenerative circuit 130 to substantially second voltage level 115. To this end, voltage translation circuit 100 preferably includes an inverter 155 for inverting input signal 105 such that first switch 145 closes responsive to inverted input signal 149 increasing from first voltage level 110 to second voltage level 115. According to another exemplary embodiment, first switch 145 simply closes responsive to input signal 105 being at first voltage level 110 when voltage translation circuit 100 receives power, thereby decreasing the voltage level at first terminal 135 of regenerative circuit 130 to substantially second voltage level 115.

Voltage translation circuit 100 further includes a second switch 150 coupled to second terminal 140 of regenerative circuit 130. When second switch 150 closes, second switch 150 decreases the voltage level at second terminal 140. In particular, second switch 140 closes responsive to input signal 105 increasing from first voltage level 110 to second voltage level 115, thereby decreasing the voltage level at second terminal 140 of regenerative circuit 130 to substantially second voltage level 115. To this end, voltage translation circuit 100 preferably further includes a second inverter 160 for inverting inverted input signal 149 such that second switch 150 closes responsive to input signal 105 increasing from first voltage level 110 to second voltage level 115. According to another embodiment, second switch 150 closes responsive to input signal 105 being at second voltage level 115 when voltage translation circuit 100 receives power, thereby decreasing the voltage level at second terminal 140 of regenerative circuit 130 to substantially second voltage level 115.

Figure 2:
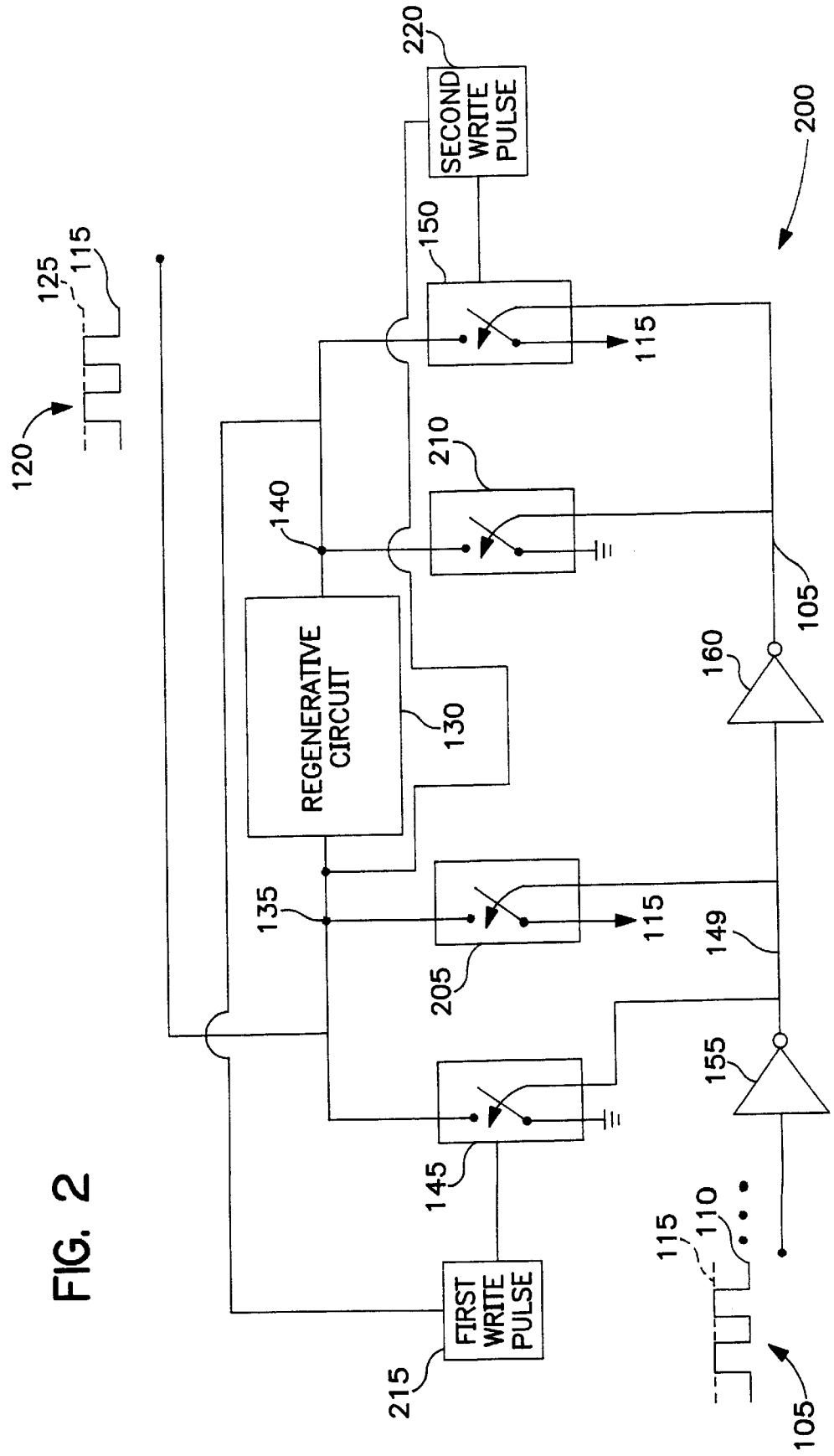
FIG. 2 is a block diagram of a voltage translation circuit according to a further exemplary embodiment of the present invention.

FIG. 2 is a block diagram of a voltage translation circuit 200 according to another exemplary embodiment of the present invention. Voltage translation circuit 200 shares some similarities with voltage translation circuit 100, illustrated in FIG. 1. Voltage translation circuit 200, however, differs from voltage translation circuit 100 in several aspects.

Similar to voltage translation circuit 100, voltage translation circuit 200 includes: (i) first switch 145 closing responsive to input signal 105 decreasing from second voltage level 115 to first voltage level 110, thereby decreasing the voltage level at first terminal 135 of regenerative circuit 130, and (ii) second switch 140 closing responsive to input signal 105 increasing from first voltage level 110 to second voltage level 115, thereby decreasing the voltage level at second terminal 140 of regenerative circuit 130. First and second switches 145 and 150 of voltage translation circuit 200, however, decrease the voltage levels at first terminal 135 and second terminal 140, respectively, to first voltage level 110. Voltage translation circuit 200 further includes a third switch 205 coupled to first terminal 135 of regenerative circuit 130. Third switch 205 closes to decrease the voltage level at first terminal 135 to substantially second voltage level 115 responsive to input signal 105 being at first voltage level 110 when voltage translation circuit 200 receives power. Voltage translation circuit 200 further includes a fourth switch 210 coupled to second terminal 140 of regenerative circuit 130. Fourth switch 210 closes to decrease the voltage level at second terminal 140 to substantially second voltage level 115 responsive to input signal 105 being at second voltage level 115 when voltage translation circuit 200 receives power.

Voltage translation circuit 200 further includes a first write-pulse circuit 215 coupled between first switch 145 and second terminal 140 of regenerative circuit 130. First write-pulse circuit 215 opens first switch 145 responsive to the voltage level increasing at second terminal 140. A second write-pulse circuit 220 is coupled between second switch 150 and first terminal 135 of regenerative circuit 130. Second write-pulse circuit 220 opens first switch 145 responsive to the voltage level increasing at second terminal 140.

Figure 3A:
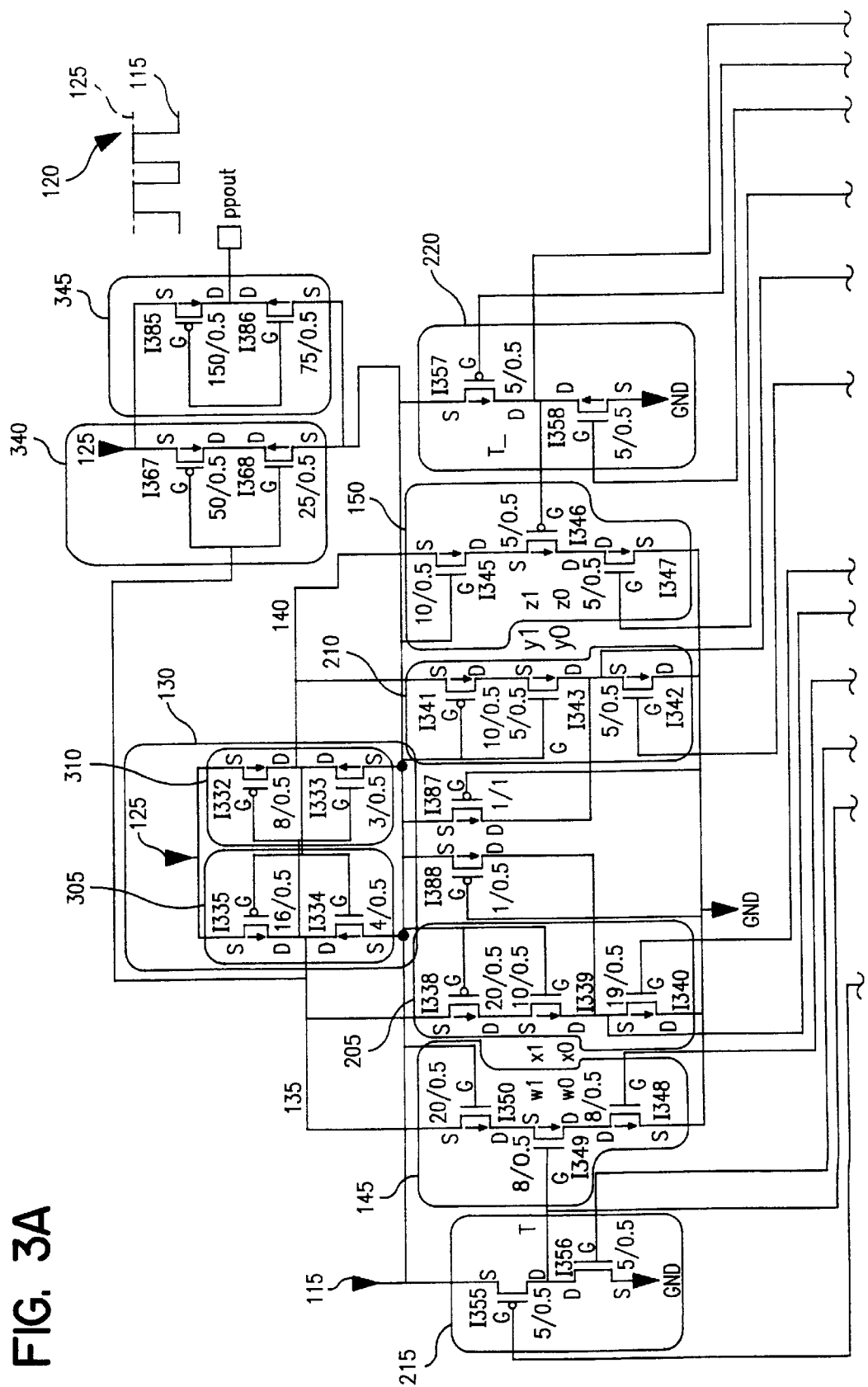
Figure 3B:
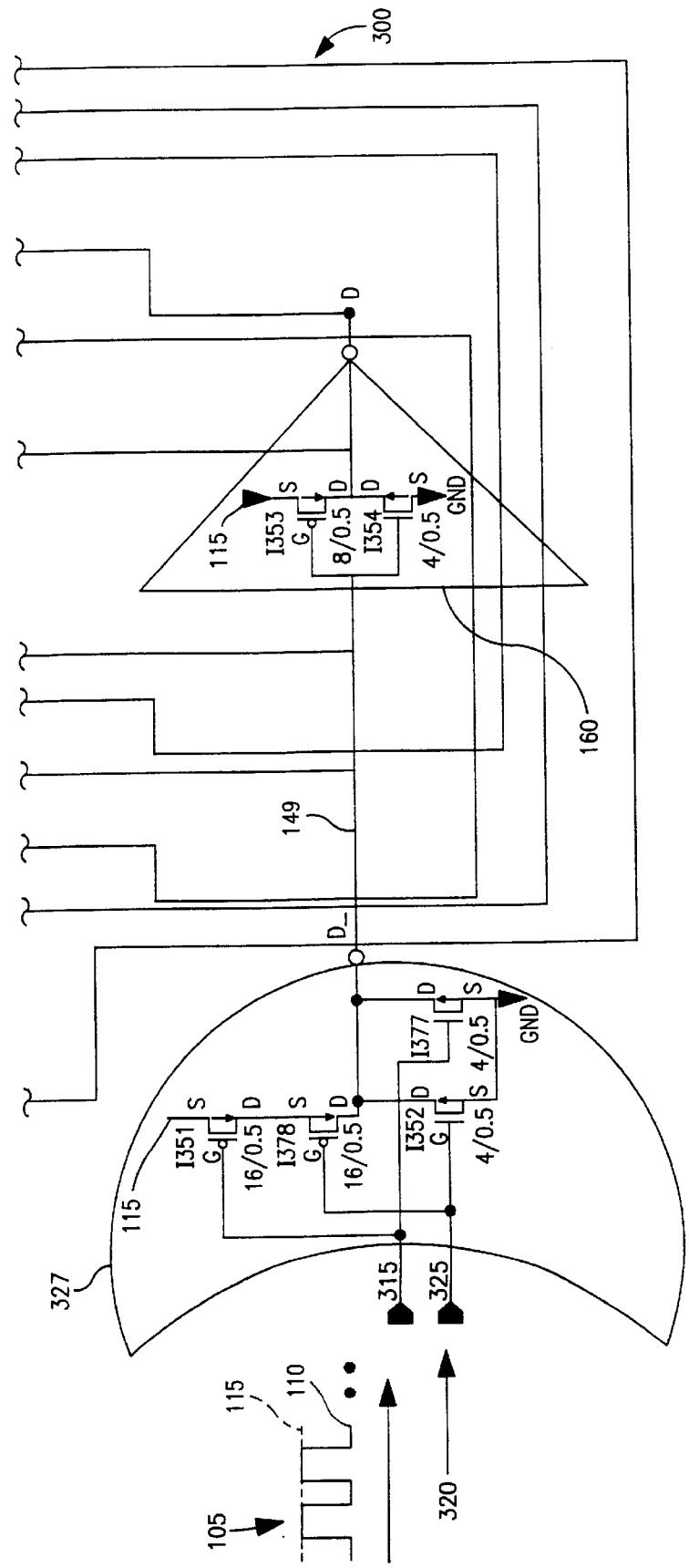

FIG. 3 shows the internal circuitry of the blocks of the voltage translation circuit of FIG. 2. Voltage translation circuit 300 shares some similarities with voltage translation circuits 100 and 200, illustrated in FIGS. 1 and 2, respectively. Voltage translation circuit 300, however, further describes features of voltage translation circuits 100 and 200 and introduces additional features to those of voltage translation circuits 100 and 200. The n-type and p-type transistors used according to the embodiment of the invention illustrated in FIG. 3 are represented by nFETs and pFETs, respectively. The source and drain of each FET may generally be interchanged, as readily understood by those skilled in the art. Voltage translation circuit 300 is preferably built on an integrated circuit using CMOS processes. The particular types of transistors used may vary depending on desired voltage levels.

As illustrated in FIG. 3, input signal 105 is applied to terminal 315 of voltage translation circuit 300, and enable signal 320 is applied to terminal 325 of voltage translation circuit 300. A NOR operation is performed between Input signal 105 and enable signal 320 at NOR gate 327 to produce inverted input signal 149 at node D__ when enable signal 320 is at second voltage level 115. NOR gate 327 may include, for example, p-type transistors I351 and I378, as well as n-type transistors I352 and I377. As illustrated in FIG. 3, the gates of p-type transistor I351 and n-type transistor I377 function as one input to NOR gate 327. The gates of p-type transistor I378 and I377 function as the other input to NOR gate 327. The second voltage level 115 is applied to the source of p-type transistor I351. The drain of p-type transistor I351 is coupled to the source of p-type transistor I378. The drain of p-type transistor I378 is coupled to the drains of n-type transistors I352 and I377, defining the output of NOR gate 327 at node D__. Current is conducted to ground from the sources of n-type transistors I352 and I377.

Voltage translation circuit 300 further includes inverter 147 for inverting inverted input signal 149 at node D__ to produce input signal 105 at node D. Inverter 147 may include, for example, a p-type transistor I353 and an n-type transistor I354. The gates of p-type transistor I353 and n-type transistor I354 are coupled at node D__ to define the input to inverter 147. The drains of p-type transistor and n-type transistor are coupled to define the output to inverter 147 at node D. The second voltage level 115 is applied to the source of p-type transistor I353. Current from the source of n-type transistor I354 is conducted to ground.

Regenerative circuit 130 of voltage translation circuit 300 includes a first inverter 305 and a second inverter 310. The output of first inverter 305 defines first terminal 135 of regenerative circuit 130 and the output of second inverter 310 defines the second terminal of regenerative circuit 130. First inverter 305 and second inverter 310 are cross-coupled in that: (i) the output of first inverter 305 is coupled to the input of second inverter 310, and (ii) the output of second inverter 310 is coupled to the input of first inverter 305. In this way, regenerative circuit 130 statically, that is, without burning DC power, translates second voltage level 115 applied at first terminal 135 to third voltage level 125 at second terminal 140. Similarly, regenerative circuit 130 statically translates second voltage level 115 applied at second terminal 140 to third voltage level 125 at first terminal 140.

First inverter 305 may include, for example, a first p-type transistor I335 and a first n-type transistor I334. Second inverter 310 includes a second p-type transistor and I332 and a second n-type transistor I333. The gates of first p-type transistor I335 and first n-type transistor I334 are coupled together to define the input to first inverter 305. Similarly, the gates of second p-type transistor I332 and second n-type transistor I333 are coupled together to define the input to second inverter 310. The drains of first p-type transistor I335 and first n-type transistor I334 are coupled together to define the output of first inverter 305 and first terminal 135 of regenerative circuit 130. Similarly, the drains of second p-type transistor I332 and second n-type transistor I333 are coupled together to define the output of second inverter 310 and second terminal 130 of regenerative circuit 130. Cross-coupling of inverters 305 and 310 is accomplished by: (i)

coupling the drains of first p-type transistor I335 and first n-type transistor I334 to the gates of second p-type transistor I332 and second n-type transistor I333, and (ii) coupling the drains of second p-type transistor I332 and second p-type transistor I333 to the gates of first p-type transistor I335 and first n-type transistor I334. To achieve the desired voltage translation, third voltage level 125 is applied to the sources of first p-type transistor I335 and second p-type transistor I332, and second voltage level 115 is applied to the sources of first n-type transistor I334 and second n-type transistor I333. In this way, second voltage level 115 acts as a virtual ground for n-type transistor I334 of first inverter 305 and n-type transistor I333 of second inverter 310 and, therefore, for regenerative circuit 130.

First terminal 135 of regenerative circuit 130 is buffered through inverter 340 configured with a p-type transistor I367 and an n-type transistor I368 as shown in FIG. 3, and inverter 345, configured with a p-type transistor I385 and an n-type transistor I388 as shown in FIG. 3, to ensure that output signal 350 swings between second voltage level 115 and third voltage level 125.

First switch 145 of voltage translation circuit 300 includes a first n-type transistor I348, a second n-type transistor I349 and a third n-type transistor I350. Current from the drain of first n-type transistor I348 is conducted to ground. The source of first n-type transistor I348 is coupled to the drain of second n-type transistor I349 at node w0. The gate of I348 is coupled to node D_ such that n-type transistor I348 is responsive to inverted input signal 149. In this way, first n-type transistor I348 closes responsive to inverted input signal 149 increasing from first voltage level 110 to second voltage level 115, that is, when input signal 105 decreases from second voltage level 115 to first voltage level 110. The gate of second ntype transistor I349 is coupled to the output of first write-pulse circuit 215 at node T such that second n-type transistor I349 is selectively opened by first write-pulse circuit 215. The source of second n-type transistor I349 is coupled to the drain of third n-type transistor I350 at node w1. The second voltage level 115 is applied to the gate of third n-type transistor I350. The source of third n-type transistor I350 is coupled to first terminal 135 of regenerative circuit 130.

Second switch 150 of voltage translation circuit 300 includes a first n-type transistor I347, a second n-type transistor I346 and a third n-type transistor I345. Current from the drain of first n-type transistor I347 is conducted to ground. The source of first n-type transistor I347 is coupled to the drain of second n-type transistor I346 at node z0. The gate of I347 is coupled to node D such that n-type transistor I347 is responsive to input signal 105. In this way, first n-type transistor I347 closes responsive to input signal 105 increasing from first voltage level 110 to second voltage level 115. The gate of second n-type transistor I346 is coupled to the output of second write-pulse circuit 220 at node T_ such that second n-type transistor I346 is selectively opened by second write-pulse circuit 220. The source of second n-type transistor I346 is coupled to the drain of third n-type transistor I345 at node z1. The second voltage level 115 is applied to the gate of third n-type transistor I345. The source of third n-type transistor I345 is coupled to second terminal 140 of regenerative circuit 130.

Third switch 205 of voltage translation circuit 300 includes a first n-type transistor I340, a second n-type transistor I339 and a p-type transistor I338. Current from the drain of first n-type transistor I340 is conducted to ground. The source of first n-type transistor I340 is coupled to the drain of second n-type transistor I339 at node x0. The gate of first n-type transistor I340 is responsive to input signal 105 such that n-type transistor I340 closes when input signal 105 is at first voltage level 110 when voltage translation circuit 300 receives power. The source of second n-type transistor I339 is coupled to the drain of p-type transistor I338 at node x1. The second voltage level 115 is applied to the gates of second n-type transistor I339 and p-type transistor I338. The source of p-type transistor I338 is coupled to first terminal 135 of regenerative circuit 130. In this way, transistors I338 and I339 function collectively as a voltage divider to ensure that third voltage level 125 is not applied across I340 when first terminal 135 of regenerative circuit 130 is pulled up to third voltage level 125. Third switch 205 operates at a slower rate than first switch 145, but it prevents an indeterminate power-up state and guarantees write functionality to first terminal 135 of regenerative circuit 130.

Fourth switch 210 of voltage translation circuit 300 includes a first n-type transistor I342, a second n-type transistor I343 and a p-type transistor I341. Current from the drain of first n-type transistor I342 is conducted to ground. The source of first n-type transistor I342 is coupled to the drain of second n-type transistor I343 at node y0. The gate of first n-type transistor I342 is responsive to input signal 105 such that n-type transistor I342 closes when input signal 105 is at second voltage level 115 when voltage translation circuit 300 receives power. The source of second n-type transistor I343 is coupled to the drain of p-type transistor I341 at node y1. The second voltage level 115 of input signal 105 is applied to the gates of second n-type transistor I343 and p-type transistor I341. The source of p-type transistor I341 is coupled to second terminal 140 of regenerative circuit 130. In this way, transistors I341 and I343 function collectively as a voltage divider to ensure that third voltage level 125 is not applied across I342 when second terminal 140 of regenerative circuit 130 is pulled up to third voltage level 125. Fourth switch 210 operates at a slower rate than second switch 150, but it prevents an indeterminate power-up state and guarantees write functionality to second terminal 140 of regenerative circuit 130.

First write-pulse circuit 215 of voltage translation circuit 300 includes an n-type transistor I356 and a p-type transistor I355. The gate of n-type transistor I356 is coupled to node y0 of fourth switch 210. In this way, first write-pulse circuit 215 closes responsive to the voltage level increasing at fourth switch 210, thereby opening second n-type transistor I349 of first switch 145. Current from the source of n-type transistor I356 is conducted to ground. The drain of n-type transistor I356 is coupled to the drain of p-type transistor I355 and to the gate of second n-type transistor I349 of first switch 145 at node T. The second voltage level 115 is applied to the source of p-type transistor I355.

Second write-pulse circuit 220 of voltage translation circuit 300 includes an n-type transistor I358 and a p-type transistor I357. The gate of n-type transistor I358 is coupled to node x0 of third switch 210. In this way, second write-pulse circuit 220 closes responsive to the voltage level increasing at third switch 205, thereby opening second n-type transistor I348 of second switch 150. Current from the source of n-type transistor I358 is conducted to ground. The drain of n-type transistor I358 is coupled to the drain of p-type transistor I357 and to the gate of second n-type transistor I346 of second switch 150 at node T_. The second voltage level 115 is applied to the source of p-type transistor I357. The gate of p-type transistor I357 of second write-pulse circuit 220 is coupled to node T. The gate of p-type transistor I355 of first write-pulse circuit 215 is coupled to node T_.

Voltage translation circuit 300 further includes a first pull-up circuit embodied in the form of a p-type transistor I388. Second voltage level 115 is applied to the source of p-type transistor I388. The drain of p-type transistor I388 is coupled to node x0 of third switch 205. The gate of p-type transistor I388 is responsive to input signal 105 such that p-type transistor I388 closes, supplying current to and thereby increases the voltage at node x0 of third switch 205 responsive to input signal 105 being at second voltage level 115.

Voltage translation circuit 300 further includes a second pull-up circuit embodied in the form of a p-type transistor I387. Second voltage level 115 is applied to the source of p-type transistor I387. The drain of p-type transistor I387 is coupled to node y0 of fourth switch 210. The gate of p-type transistor I387 is responsive to input signal 105 such that p-type transistor I387 closes, supplying current to and thereby increases the voltage at node y0 of fourth switch 205 responsive to input signal 105 being at first voltage level 110.

MODES OF OPERATION

The operation of voltage translation circuit 300 is described with reference to FIGS. 3 and 4. In the example illustrated in FIG. 4, first voltage level 110 is approximately 0 volts, second voltage level 115 is approximately 1.8 volts, and third voltage level 125 is approximately 3.3 volts. In another example, first voltage level 110 is approximately 0 volts, second voltage level is approximately 2.5 volts, and third voltage level is approximately 5 volts.

1. Power-Up of Voltage Translation Circuit

The operation of voltage translation circuit 300 is described when it first receives power and/or enable signal 320 switches to second voltage level 115. At this time, input data signal 105 may be either at first voltage level 110 or second voltage level 115.

a. Input Data Signal at First Voltage Level

If input data signal 105 is at first voltage level 110, input data signal 105 is NOR'ed with enable signal 320 at NOR gate 327 to produce inverted input data signal 149 having second voltage level 115 at node D__. The gate of n-type transistor I340 of first switch 145 responds to the voltage at node D__ existing at second voltage level 115 and closes, passing a minimal voltage across the source and drain of I340. Because the drain of I340 is connected to ground, the closing of I340 pulls node x0 approximately to first voltage level 110. As the gate of p-type transistor I388 is also responsive to the voltage level at node D__, node D__ existing at second voltage level opens I388 such that no current flows from the drain of I388 to node x0. Because the second voltage level 115 is applied to the gate of I339, I339 is closed, passing a minimal voltage across the source and drain of I339. Therefore, node x1 follows node x0 in being pulled approximately to first voltage level 110. P-type transistor I338, having second voltage level 115 applied to the gate of I338 and approximately first voltage level 110 applied to the drain of I338, passes approximately the threshold voltage of p-type transistor I338 above second voltage level 115 at the source of I338. In this way, because the source of I338 is coupled to first terminal 135 of regenerative circuit 130, I338 pulls the voltage level at first terminal 135 of regenerative circuit 130 to substantially second voltage level 115. Accordingly, regenerative circuit 130 regenerates third voltage level 125 at second terminal 140. N-type transistor I334, responsive to the regenerated third voltage level 125 at second terminal 140, causes the voltage level at first terminal 135 to stabilize at second voltage level 115. The voltage level at first terminal 135 of regenerative circuit 130 is also buffered through inverters 340 and 345 to ensure that output signal 120 has a sufficient slew rate to drive subsequent devices.

Inverted input data signal 149 at node D__ is inverted by inverter 160 to produce original input data signal 105 having first voltage level 110 at node D, at approximately the same time the gate of n-type transistor I340 responds to the voltage at node D__ existing at second voltage level 115 and closes I340. Because the gate of n-type transistor I342 of fourth switch 210 is responsive to node D, n-type transistor I342 opens while node D exists at first voltage level 110. P-type transistor I387 closes in response to node D existing at first voltage level 110, allowing current to flow from the source of I387, at which second voltage level 115 is applied, through the drain of I387 to node y0, causing the potential at y0 to rise to approximately second voltage level 115. P-type transistor I341 remains closed as second voltage level 115 is applied to the gate of p-type transistor I341. Accordingly, as regenerative circuit 130 regenerates third voltage level 125 at second terminal 140, p-type transistor I341 passes third voltage level 125 to node y1. As second voltage level 115 is applied to the gate of n-type transistor I343, and third voltage level 125 is applied to the source of I343 at node y1, n-type transistor I343 passes second voltage level 115 less the threshold voltage of n-type transistor I343 across the source and drain of I343.

b. Input Data Signal at Second Voltage Level

If input data signal 105 is at second voltage level 115, a NOR operation is performed between input data signal 105 with enable signal 320 at NOR gate 327 to produce inverted input data signal 149 having first voltage level 110 at node D__. Inverted input data signal 149, in turn, is inverted by inverter 160 to produce original input data signal 105 having second voltage level 115 at node D. The gate of n-type transistor I342 responds to the voltage at node D existing at second voltage level 115 and closes, passing a minimal voltage across the source and drain of I342. Because the drain of I342 is connected to ground, the closing of I342 pulls node y0 approximately to first voltage level 110. As the gate of p-type transistor I387 is also responsive to the voltage level at node D, node D existing at second voltage level opens I387 such that no current flows from the drain of I387 to node y0. Because the second voltage level 115 is applied to the gate of I343, I343 closes, passing a minimal voltage across the source and drain of I343. Therefore, node y1 follows node y0 in being pulled approximately to first voltage level 110. P-type transistor I341, having second voltage level 115 applied to the gate of I341 and approximately first voltage level 110 applied to the drain of I341, passes approximately the threshold voltage of p-type transistor I341 above second voltage level 115 at the source of I341. In this way, because the source of I341 is coupled to second terminal 140 of regenerative circuit 130, I341 pulls the voltage level at second terminal 140 of regenerative circuit 130 to substantially second voltage level 115. Because regenerative circuit 130 operates between second voltage level 115 and third voltage level 125, regenerative circuit 130 regenerates third voltage level 125 at first terminal 135 in response to second terminal 140 being pulled to substantially second voltage level 115. N-type transistor I333, responsive to the regenerated third voltage level 125 at first terminal 135, causes the voltage level at second terminal 140 to stabilize at second voltage level 115. The voltage level at first terminal 135 of regenerative circuit 130 is then buffered through inverters 340 and 345 to ensure that output signal 120 has a sufficient slew rate to drive subsequent devices.

Because input data signal 105 is at second voltage level 115, inverted input data signal 149 at node D__ is at first voltage level 110. The gate of n-type transistor I342 responds to the voltage at node D existing at second voltage level 115 and closes I342, because the gate of n-type transistor I340 of third switch 205 is responsive to node D__, n-type transistor I340 opens while node D__ exists at first voltage level 110. P-type transistor I388 closes in response to node D__ existing at first voltage level 110, allowing current to flow from the source of I388, at which second voltage level 115 is applied, through the drain of I388 to node x0, causing the potential at xo to rise to approximately second voltage level 115. P-type transistor I338 remains closed as second voltage level 115 is applied to the gate of p-type transistor I338. Accordingly, as regenerative circuit 130 regenerates third voltage level 125 at first terminal 140, p-type transistor I338 passes third voltage level 125 to node x1. As second voltage level 115 is applied to the gate of n-type transistor I339, and third voltage level 125 is applied to the source of I339 at node x1, n-type transistor I339 passes second voltage level 115 less the threshold voltage of n-type transistor I339 across the source and drain of I339.

2. Input Signal Transitions a. Transition from First Voltage Level to Second Voltage Level Referring now to FIG. 4, at time t2, as input signal 105 changes from first voltage level 110 to second voltage level 115, inverted input signal 149 at node D__ changes from second voltage level 115 to first voltage level 110. N-type transistor I348, the gate of which is responsive to inverted input signal 149 at node D__, opens, thereby opening first switch 145. Similarly, n-type transistor I340, the gate of which is also responsive to inverted input signal 149 at node D__, opens, thereby opening third switch 205. P-type transistor I388 of first write-pulse circuit 215 closes in response to inverted input signal 149 at node D__ changing to first voltage level 110. As such, current flows from the source of p-type transistor I388 at which second voltage level 115 is applied through the drain of I388 to node x0.

N-type transistor I342 of fourth switch 210, the gate of which is responsive to original input signal 105 at node D, closes. Consequently, any potential at node y0 is conducted to ground through I342. P-type transistor I387 of second write-pulse circuit 220 opens in response to the original input signal 105 changing to the second voltage level 115, so no additional current flows to node y0, allowing the potential of node y0 to remain at approximately ground level. N-type transistor I356 of first write-pulse circuit 215, responsive to the voltage level at node y0, opens in response to y0 being pulled to ground.

N-type transistor I347 of second switch 150, the gate of which is responsive to original input signal 105 at node D, closes. N-type transistor I346 remains closed, as the potential at node T__ remains at second voltage level 115 from: (i) a previous transition of input signal 105 from second voltage level 115 to first voltage level 110 during a period in which the voltage level of enable signal 320 was at first voltage level 110, or (ii) from voltage translation circuit 300 first receiving power when input signal 105 is at first voltage level 110 and the voltage level of enable signal 320 is at first voltage level 110, or (iii) a previous transition of enable signal 320 from second voltage level 115 to first voltage level 110 during a period in which the voltage level of input signal 105 was at first voltage level 110. Because the gate of n-type transistor I346 is responsive to the voltage level at node T__, n-type transistor I346 is closed. Because second voltage level 115 is applied to the gate of n-type transistor I345, I345 is also closed. As such, the three n-type transistors I345, I346 and I347 included in second switch 150 are all closed, causing current to begin to flow from the second terminal 140 of regenerative circuit 130 through n-type transistors I345, I346 and I347 to ground. The voltage level at second terminal 140 of regenerative circuit 130 begins to be pulled to ground by second switch 150. Regenerative circuit 130 then regenerates third voltage level 125 at first terminal 135.

As regenerative circuit 130 regenerates third voltage level 125 at first terminal 140, p-type transistor I338 passes third voltage level 125 to node x1. As second voltage level 115 is applied to the gate of n-type transistor I339, and third voltage level 125 is applied to the source of I339 at node x1, n-type transistor I339 passes second voltage level 115 less the threshold voltage of n-type transistor I339 across the source and drain of I339. Current continues to flow from the source of p-type transistor I388 at which second voltage level 115 is applied through the drain of I388 to node x0, causing the potential at node x0 to increase from second voltage level 115 less the threshold voltage of n-type transistor I339 to approximately second voltage level 115.

N-type transistor I358 of second write-pulse circuit 220, responsive to the voltage level at node x0, closes in response to the voltage level at node x0 increasing to approximately second voltage level 115. The closing of I358 causes any existing potential at node T__ to begin being conducted to ground through n-type transistor I358. P-type transistor I355 of first write-pulse circuit 215, the gate of which is responsive to the voltage level at node T__, closes. The closing of p-type transistor I355, in combination with n-type transistor I356 remaining open in response to the voltage level at node y0 being pulled approximately to ground, causes the voltage level at node T to increase to approximately second voltage level 115, as second voltage level 115 is applied to the source of p-type transistor I355. P-type transistor I357 of second write-pulse circuit 220, responsive to the voltage level at node T, opens. Because n-type transistor I358 of second write-pulse circuit remains closed, the voltage level at node T__ is pulled approximately to ground level, causing n-type transistor I346 to open, thereby opening second switch 150 before the voltage level at second terminal 140 of regenerative circuit 130 is pulled to ground level.

It is desirable to open second switch 150 before the voltage level at second terminal 140 of regenerative circuit 130 is pulled to ground level to prevent overvoltage stresses from occurring across transistors of regenerative circuit 130. Such overvoltage stresses arise when a voltage level exceeding gate oxide breakdown limits and/or exceeding source-to-drain bias limits is applied across any two terminals of a transistor. The amount of voltage creating an overvoltage condition varies according to the particular transistors used in a desired implementation. In one example where the third voltage level is approximately 3.3 volts, pulling the potential at second terminal 140 to ground level causes p-type transistor I332 to have approximately 0 volts at its drain, 3.3 volts at its gate, and 3.3 volts at its source. This creates overvoltage stresses across the gate and drain of I332 and across the source and drain of I332, either of which could cause p-type transistor I332 to be damaged from overvoltage stresses. As such, the timing of regenerative circuit 300 is preferably adjusted such that second switch 150 is opened before the voltage level at second terminal 140 of regenerative circuit 130 is pulled to ground level.

b. Transition from Second Voltage Level to First Voltage Level

Referring now to FIG. 4, at time t1, as input signal 105 changes from second voltage level 115 to first voltage level 110, inverted input signal 149 at node D__ changes from first voltage level 110 to second voltage level 115. Inverted input signal 149 is inverted by inverter 160 to produce original input signal 105 at node D. N-type transistor I347, the gate of which is responsive to original input signal 105 at node D, opens, thereby opening second switch 150. Similarly, n-type transistor I342 of fourth switch 210, the gate of which is also responsive to original input signal 105 at node D, opens, thereby opening fourth switch 210. P-type transistor I387 of second write-pulse circuit 220 closes in response to input signal 105 at node D changing to first voltage level 110. As such, current flows from the source of p-type transistor I387, at which second voltage level 115 is applied, through the drain of I387 to node y0.

N-type transistor I340 of third switch 205, the gate of which is responsive to inverted input signal 149 at node D__, closes. Consequently, any potential at node x0 is conducted to ground through I340. P-type transistor I388 of first write-pulse circuit 215 opens in response to inverted input signal 149 changing to second voltage level 115, so no additional current flows to node x0, allowing the potential of node x0 to remain at approximately ground level. N-type transistor I358 of second write-pulse circuit 220, responsive to the voltage level at node x0, opens in response to x0 being pulled to ground.

N-type transistor I348 of first switch 145, the gate of which is responsive to inverted input signal 149 at node D__, closes. N-type transistor I349 remains closed, as the potential at node T remains at second voltage level 115 from: (i) a previous transition of input signal 105 from first voltage level 110 to second voltage level 115 during a period in which the voltage level of enable signal 320 was at first voltage level 110, or (ii) from voltage translation circuit 300 first receiving power when either input signal 105 is at second voltage level 115 or the voltage level of enable signal 320 is at second voltage level 115, or (iii) a previous transition of enable signal 320 from first voltage level 110 to second voltage level 115 during a period in which the voltage level of input signal 105 was at first voltage level 110. Because the gate of n-type transistor I349 is responsive to the voltage level at node T, n-type transistor I349 is closed. Because second voltage level 115 is applied to the gate of n-type transistor I350, I350 is also closed. As such, the three n-type transistors I348, I349 and I350 included in first switch 145 are all closed, causing current to begin to flow from the first terminal 135 of regenerative circuit 130 through n-type transistors I348, I349 and I350 to ground. The voltage level at first terminal 135 of regenerative circuit 130 begins to be pulled to ground by first switch 145. Regenerative circuit 130 then regenerates third voltage level 125 at second terminal 135.

As regenerative circuit 130 regenerates third voltage level 125 at second terminal 140, p-type transistor I341 passes third voltage level 125 to node y1. As second voltage level 115 is applied to the gate of n-type transistor I343, and third voltage level 125 is applied to the source of I343 at node y1, n-type transistor I343 passes second voltage level 115 less the threshold voltage of n-type transistor I343 across the source and drain of I343. Current continues to flow from the source of p-type transistor I387 at which second voltage level 115 is applied through the drain of I387 to node y0, causing the potential at node y0 to increase from second voltage level 115 less the threshold voltage of n-type transistor I343 to approximately second voltage level 115.

N-type transistor I356 of first write-pulse circuit 215, responsive to the voltage level at node y0, closes in response to the voltage level at node y0 increasing to approximately second voltage level 115. The closing of I356 causes any existing potential at node T to begin being conducted to ground through n-type transistor I356. P-type transistor I357 of second write-pulse circuit 220, the gate of which is responsive to the voltage level at node T, closes. The closing of p-type transistor I357, in combination with n-type transistor I358 remaining open in response to the voltage level at node x0 being pulled approximately to ground, causes the voltage level at node T__ to increase to approximately second voltage level 115, as second voltage level 115 is applied to the source of p-type transistor I357. P-type transistor I355 of first write-pulse circuit 215, responsive to the voltage level at node T__, opens. Because n-type transistor I356 of first write-pulse circuit remains closed, the voltage level at node T is pulled approximately to ground level, causing n-type transistor I349 to open, thereby opening first switch 145 before the voltage level at first terminal 135 of regenerative circuit 130 is pulled to ground level.

It is desirable to open first switch 145 before the voltage level at first terminal 135 of regenerative circuit 130 is pulled to ground level to prevent overvoltage stresses from occurring across transistors of regenerative circuit 130. In one example where the third voltage level is approximately 3.3 volts, pulling the potential at first terminal 135 to ground level would cause p-type transistor I335 to have approximately 0 volts at its drain, 3.3 volts at its gate, and 3.3 volts at its source. This would create overvoltage stresses across the gate and drain of I335 and across the source and drain of I335, either of which could cause p-type transistor I335 to be damaged from overvoltage stresses. As such, the timing of regenerative circuit 300 is preferably adjusted such that first switch 145 is opened before the voltage level at first terminal 135 of regenerative circuit 130 is pulled to ground level.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A voltage translation circuit for translating an input signal having a first voltage level and a second voltage level to an output signal having the second voltage level and a third voltage level respectively, comprising:

a regenerative circuit having a first terminal and a second terminal, the voltage level at the first terminal increasing responsive to the voltage level at the second terminal decreasing, the voltage level at the second terminal increasing responsive to the voltage level at the first terminal decreasing, the voltage level at the first terminal defining the output signal;

a first switch coupled to the first terminal of said regenerative circuit, the closing of the first switch decreasing the voltage level at the first terminal; and a second switch coupled to the second terminal of said regenerative circuit, the closing of the second switch decreasing the voltage level at the second terminal.

2. The voltage translation circuit according to claim 1 wherein:

i) the voltage level at the first terminal of said regenerative circuit increases to the third voltage level responsive to the voltage level at the second terminal decreasing to substantially the second voltage level, and ii) the voltage level at the second terminal of said regenerative circuit increases to the third voltage level responsive to the voltage level at the first terminal decreasing to substantially the second voltage level.

3. The voltage translation circuit according to claim 1 wherein said regenerative circuit includes:
  i) a first p-type transistor and a first n-type transistor, and
  ii) a second p-type transistor and a second n-type transistor,
  the drains of the first p-type transistor and first n-type transistor defining the first terminal of said regenerative circuit and being coupled to the gates of the second p-type transistor and second n-type transistor,
  the drains of the second p-type transistor and second n-type transistor defining the second terminal of said regenerative circuit and being coupled to the gates of the first p-type transistor and first n-type transistor.

4. The voltage translation circuit according to claim 1 wherein said regenerative circuit includes a first inverter and a second inverter, the output of the first inverter defining the first terminal of said regenerative circuit and being coupled to the input of the second inverter, the output of the second inverter defining the second terminal of said regenerative circuit and being coupled to the input of the first inverter.

5. The voltage translation circuit according to claim 1 wherein:
  i) said first switch closes responsive to the input signal decreasing from the second voltage level to the first voltage level, thereby decreasing the voltage level at the first terminal of said regenerative circuit; and
  ii) said second switch closes responsive to the input signal increasing from the first voltage level to the second voltage level, thereby decreasing the voltage level at the second terminal of said regenerative circuit.

6. The voltage translation circuit according to claim 1 wherein:
  i) said first switch closes responsive to the input signal being at the first voltage level when the voltage translation circuit receives power, thereby decreasing the voltage level at the first terminal of said regenerative circuit; and
  ii) said second switch closes responsive to the input signal being at the second voltage level when the voltage translation circuit receives power, thereby decreasing the voltage level at the second terminal of said regenerative circuit.

7. The voltage translation circuit according to claim 5 further comprising:
  a third switch coupled to the first terminal of said regenerative circuit and closing to decrease the voltage level at the first terminal responsive to the input signal being at the first voltage level when the voltage translation circuit receives power, and
  a fourth switch coupled to the second terminal of said regenerative circuit and closing to decrease the voltage level at the second terminal responsive to the input signal being at the second voltage level when the voltage translation circuit receives power.

8. The voltage translation circuit according to claim 1 further comprising an inverter for inverting the input signal such that said first switch closes responsive to the inverted input signal increasing from the first voltage level to the second voltage level, thereby decreasing the voltage level at the first terminal of said regenerative circuit.

9. The voltage translation circuit according to claim 8 further comprising a second inverter for inverting the inverted input signal such that said second switch closes responsive to the input signal increasing from the first voltage level to the second voltage level, thereby decreasing the voltage level at the second terminal of said regenerative circuit.

10. The voltage translation circuit according to claim 1 further comprising:
  a first write-pulse circuit coupled to the first switch and opening the first switch responsive to the voltage level increasing at the second terminal of said regenerative circuit, and
  a second write-pulse circuit coupled to the second switch and opening said second switch responsive to the voltage level increasing at the first terminal of said regenerative circuit.

11. The voltage translation circuit according to claim 7 further comprising:
  a first write-pulse circuit coupled between the first switch and the fourth switch and opening said first switch responsive to the voltage level increasing at the fourth switch, and
  a second write-pulse circuit coupled between the second switch and the third switch and opening the second switch responsive to the voltage level increasing at the third switch.

12. The voltage translation circuit according to claim 5 wherein:
  said first switch includes:
    i) a first n-type transistor closing responsive to the input signal decreasing from the second voltage level to the first voltage level,
    ii) a second n-type transistor coupled between the first terminal of said regenerative circuit and the first n-type transistor and selectively opened,
  said second switch includes:
    i) a first n-type transistor closing responsive to the input signal increasing from the first voltage level to the second voltage level,
    ii) a second n-type transistor coupled between the second terminal of said regenerative circuit and the first n-type transistor and selectively opened.

13. The voltage translation circuit according to claim 6 wherein:
  said first switch includes:
    i) an n-type transistor closing responsive to the input signal being at the first voltage level when the voltage translation circuit receives power,
    ii) a p-type transistor coupled between the n-type transistor and the first terminal of said regenerative circuit and decreasing the voltage level at the first terminal of said regenerative circuit responsive to the n-type transistor closing; and
  said second switch includes:
    i) an n-type transistor closing responsive to the input signal being at the second voltage level when the voltage translation circuit receives power,
    ii) a p-type transistor coupled between the n-type transistor and the second terminal of said regenerative circuit and decreasing the voltage level at the second terminal of said regenerative circuit responsive to the n-type transistor closing.

14. The voltage translation circuit according to claim 7 wherein:
  said third switch includes:
    i) an n-type transistor closing responsive to the input signal being at the first voltage level when the voltage translation circuit receives power,
    ii) a p-type transistor coupled between the n-type transistor and the first terminal of said regenerative circuit and decreasing the voltage level at the first terminal of said regenerative circuit responsive to the n-type transistor closing; and said fourth switch includes:
  i) an n-type transistor closing responsive to the input signal being at the second voltage level when the voltage translation circuit receives power,
  ii) a p-type transistor coupled between the n-type transistor and the second terminal of said regenerative circuit and decreasing the voltage level at the second terminal of said regenerative circuit responsive to the n-type transistor closing.

15. The voltage translation circuit according to claim 11 wherein:
  i) said first write-pulse circuit includes an n-type transistor closing responsive to the voltage level increasing at the fourth switch, thereby opening said first switch; and
  ii) said second write-pulse circuit includes an n-type transistor closing responsive to the voltage level increasing at the third switch, thereby opening said second switch.

16. The voltage translation circuit according to claim 14 further comprising:
  i) a first write-pulse circuit including an n-type transistor coupled to the second n-type transistor in the first switch and closing responsive to the voltage level increasing at the fourth switch, thereby opening said second n-type transistor in the first switch; and
  ii) a second write-pulse circuit including an n-type transistor coupled to the second n-type transistor in the second switch and closing responsive to the voltage level increasing at the third switch, thereby opening said second n-type transistor in the second switch.

17. The voltage translation circuit according to claim 11 further comprising:
  a first pull-up circuit coupled to the third switch for increasing the voltage at the third switch responsive to the input signal being at the second voltage level; and
  a second pull-up circuit coupled to the third switch for increasing the voltage at the third switch responsive to the input signal being at the first voltage level.

18. The voltage translation circuit according to claim 17 wherein each of the first and second pull-up circuits includes a p-type transistor.

19. A voltage translation circuit for translating an input signal having a first voltage level and a second voltage level to an output signal having the second voltage level and a third voltage level respectively, comprising:
  a regenerative circuit having a first terminal and a second terminal, the voltage level at the first terminal increasing to the third voltage level responsive to the voltage level at the second terminal decreasing, the voltage level at the second terminal increasing to the third voltage level responsive to the voltage level at the first terminal decreasing, the voltage level at the first terminal defining the output signal;
  a first switch coupled to the first terminal of said regenerative circuit, the first switch closing responsive to the input signal decreasing from the second voltage level to the first voltage level, thereby decreasing the voltage level at the first terminal of said regenerative circuit;
  a second switch coupled to the second terminal of said regenerative circuit, the second switch closing responsive to the input signal increasing from the first voltage level to the second voltage level, thereby decreasing the voltage level at the second terminal of said regenerative circuit;
  a third switch coupled to the first terminal of said regenerative circuit and closing to decrease the voltage level at the first terminal to substantially the second voltage level responsive to the input signal being at the first voltage level when the voltage translation circuit receives power;
  a fourth switch coupled to the second terminal of said regenerative circuit and closing to decrease the voltage level at the second terminal to substantially the second voltage level responsive to the input signal being at the second voltage level when the voltage translation circuit receives power;
  a first write-pulse circuit coupled between the first switch and the second terminal of the regenerative circuit and opening said first switch responsive to the voltage level increasing at the second terminal; and
  a second write-pulse circuit coupled between the second switch and the first terminal of the regenerative circuit and opening the second switch responsive to the voltage level increasing at the first terminal.

20. The voltage translation circuit according to claim 19 wherein said regenerative circuit includes:
  i) a first p-type transistor and a first n-type transistor, and
  ii) a second p-type transistor and a second n-type transistor,
  the drains of the first p-type transistor and first n-type transistor defining the first terminal of said regenerative circuit and being coupled to the gates of the second p-type transistor and second n-type transistor,
  the drains of the second p-type transistor and second n-type transistor defining the second terminal of said regenerative circuit and being coupled to the gates of the first p-type transistor and first n-type transistor,
  the third voltage level being applied to the sources of the first and second p-type transistors, the second voltage level being applied to the sources of the first and second n-type transistors such that said regenerative circuit operates between the second voltage level and the third voltage level.

21. The voltage translation circuit according to claim 19 further comprising an inverter for inverting the input signal such that said first switch closes responsive to the inverted input signal increasing from the first voltage level to the second voltage level, thereby decreasing the voltage level at the first terminal of said regenerative circuit.

22. The voltage translation circuit according to claim 21 further comprising a second inverter for inverting the inverted input signal such that said second switch closes responsive to the input signal increasing from the first voltage level to the second voltage level, thereby decreasing the voltage level at the second terminal of said regenerative circuit.

23. The voltage translation circuit according to claim 19 further comprising a NOR gate for performing a NOR operation between the input signal and an enable signal such that said first switch closes responsive to the inverted input signal increasing from the first voltage level to the second voltage level when the enable signal is at the first voltage level, thereby decreasing the voltage level at the first terminal of said regenerative circuit.

24. The voltage translation circuit according to claim 19 wherein:
  said first switch includes a first n-type transistor closing responsive to the input signal decreasing from the second voltage level to the first voltage level, and
  said second switch includes a first n-type transistor closing responsive to the input signal increasing from the first voltage level to the second voltage level.

25. The voltage translation circuit according to claim 24 wherein:
- said first switch further includes a second n-type transistor coupled between the first terminal of said regenerative circuit and the first n-type transistor and selectively opened, and
- said second switch further includes a second n-type transistor coupled between the second terminal of said regenerative circuit and the first n-type transistor and selectively opened.

26. The voltage translation circuit according to claim 19 wherein:
- said third switch includes an n-type transistor closing responsive to the input signal being at the first voltage level when the voltage translation circuit receives power, and
- said fourth switch includes an n-type transistor closing responsive to the input signal being at the second voltage level when the voltage translation circuit receives power.

27. The voltage translation circuit according to claim 26 wherein:
- said third switch further includes an other n-type transistor coupled between the n-type transistor and the first terminal of said regenerative circuit, the other n-type transistor:
  - i) decreasing the voltage level at the first terminal of said regenerative circuit responsive to the n-type transistor closing, and
  - ii) isolating the n-type transistor from the third voltage level; and
- said fourth switch further includes an other n-type transistor coupled between the n-type transistor and the second terminal of said regenerative circuit, the other n-type transistor:
  - i) decreasing the voltage level at the second terminal of said regenerative circuit responsive to the n-type transistor closing, and
  - ii) isolating the n-type transistor from the third voltage level.

28. The voltage translation circuit according to claim 27 wherein:
- said third switch further includes a p-type transistor coupled between the other n-type transistor and the first terminal of said regenerative circuit and decreasing the voltage level at the first terminal of said regenerative circuit responsive to the n-type transistor closing, the p-type transistor isolating said regenerative circuit from the first voltage level, and
- said fourth switch further includes a p-type transistor coupled between the other n-type transistor and the second terminal of said regenerative circuit and decreasing the voltage level at the second terminal of said regenerative circuit responsive to the n-type transistor closing, the p-type transistor isolating said regenerative circuit from the first voltage level.

29. The voltage translation circuit according to claim 25 wherein:
- said first switch further includes a third n-type transistor closing responsive to the first and second n-type transistors closing; and
- said second switch further includes a third n-type transistor closing responsive to the first and second n-type transistors closing.

* * * * *